US006956394B2

(12) United States Patent
Limaye et al.

(10) Patent No.: US 6,956,394 B2
(45) Date of Patent: Oct. 18, 2005

(54) TESTER ARCHITECTURE FOR TESTING SEMICONDUCTOR INTEGRATED CIRCUITS

(75) Inventors: Ajit M. Limaye, Portland, OR (US); Peter H. Decher, Lake Oswego, OR (US); Horst R. Niehaus, Portland, OR (US)

(73) Assignee: Teseda Corporation, Portland, OR (US)

( * ) Notice: Subject to any disclaimer, the term of this patent is extended or adjusted under 35 U.S.C. 154(b) by 36 days.

(21) Appl. No.: 10/850,866

(22) Filed: May 21, 2004

(65) Prior Publication Data

US 2004/0232936 A1 Nov. 25, 2004

Related U.S. Application Data

(60) Provisional application No. 60/472,979, filed on May 22, 2003.

(51) Int. Cl.[7] .................................................. G01R 31/26
(52) U.S. Cl. ........................................................ 324/765
(58) Field of Search .................. 324/765, 759, 324/763, 764, 512, 76.61, 76.63; 365/212, 194; 702/80, 59

(56) References Cited

U.S. PATENT DOCUMENTS

| 5,396,170 | A | | 3/1995 | D'Souza et al. |
| 5,929,650 | A | | 7/1999 | Pappert et al. |
| 6,331,770 | B1 | | 12/2001 | Sugamori |
| 6,754,234 | B1 | * | 6/2004 | Wiesner et al. .............. 370/503 |
| 6,765,836 | B2 | * | 7/2004 | Menczigar ................... 365/212 |

* cited by examiner

Primary Examiner—David Zarneke
Assistant Examiner—Trung Q. Nguyen
(74) Attorney, Agent, or Firm—Klarquist Sparkman, LLP

(57) ABSTRACT

A modular tester architecture allows end-users to mix-and-match scan chain modules and clock driver modules. Modules are interconnected via a synchronization bus allowing the test modules to synchronize with each other so that each can perform its portion of the overall test at the proper time in relation to the testing performed by other modules. The modules can include a BIST driver module, a data acquisition module, networking interface modules, a controller module, a current measurement module, and a DC parametrics module, among others.

7 Claims, 8 Drawing Sheets

TESTER ARCHITECTURE FOR TESTING SEMICONDUCTOR INTEGRATED CIRCUITS

CROSS REFERENCE TO RELATED APPLICATION

This application claims the benefit of U.S. Provisional Patent Application No. 60/472,979 filed May 22, 2003, which is incorporated herein by reference.

TECHNICAL FIELD

Implementations and embodiments of the present invention relate to machines used for testing, validating and measuring the electrical characteristics of semiconductor devices (integrated circuits, or ICs) in one or more of the following states:

1. While the device is still part of the semiconductor wafer on which it was fabricated.
2. After the semiconductor wafer has been sliced up to separate individual devices, and each device has been installed into the package in which it will be used in an end-application.
3. Where the device is installed in the end user application, e.g., on a printed circuit board.

BACKGROUND

The ever increasing number of transistors that can be crammed onto a single integrated circuit device has given rise to the system on a chip (known as "SOC"). Unfortunately, as useful as SOCs are, as they continue to increase in complexity, the expense, delay and difficulty in testing them has also increased. This situation has created an ever increasing burden on the chip manufacturer and others to test SOCs and other integrated circuits (known as "ICs") without letting the associated cost of testing become prohibitive.

Wafer sort is a phrase that refers to testing of ICs at the wafer stage. "Wafer" refers to a thin disk of semiconducting material such as silicon, silicon germanium, gallium arsenide, indium phosphide onto which integrated circuits have been created, typically through etching and deposition processes. Currently, wafers are typically between 6 inches and 12 inches in diameter.

Each wafer includes a number of discrete ICs often in square or rectangular shapes and packed onto the surface of the wafer. These ICs are called "die" at this point before they are physically cut into individual ICs and packaged. The IC manufacturer tests integrated circuits while they are still physically part of the wafer.

To test the die, a machine called a wafer prober positions a finished wafer very accurately below a probe card. The probe card contains many probes, typically one for each pad on each die. The probes may be needle-like or may use a different approach, such as a membrane technology. The probes must be physically arranged in precise correspondence to the pads on the particular die to be tested in order to make electrical contact with all the pads of interest. The die contain pads for physically and electrically connecting the IC to its pins in its package or perhaps to other devices. More complicated ICs, like the microprocessor-based SOCs, often contain dozens or even hundreds of pads corresponding to the number of pins such devices require. The probe card itself is typically an annular printed circuit board between 6" and 12" in diameter Under control of the wafer prober, the wafer is pressed against the probe card so that electrical contact is made between the pads of the die and the probes. A series of electrical signals, including power, is fed through the probes into some of the pads for testing the die. Resulting electrical signals are fed back through other pads into their corresponding probes and back into the probe card for analysis. When the testing of that die is complete, the wafer prober positions the wafer such that electrical contact is made between the probe card and the next die to be tested.

Typically, one die is tested at a time, although in some cases, the probe card may connect with more than one die, allowing more than one die to be tested at the same time. This approach is limited by the number of probes that can economically be attached to one card as well as the size of the probe card and the size and weight of associated electronics used to control the probe card.

In current IC wafer sort testers, the probe card is connected through special connectors on a fixture board to pin electronics in a test head. The fixture board is physically and electrically attached to the probe card and test head. In one embodiment, there are special connectors on or interfaced to the fixture board called pogo pins through which the fixture board is connected to the probes on the probe card. In this way, the test electronics in the tester are connected through the probes on the probe card to the pads of the die, providing the electrical connection that is needed to test the die.

For mechanical stability, the test head attaches to the mechanical frame of the wafer prober. Because the typical test head is very large and heavy, they typically are mounted on large positioner machines that use counter-balancing weights to make it easier to manipulate the test head.

Traditional IC wafer sort testers, also known as automatic test equipment ("ATE") have a large test head. The size of the test head ranges from the size of the typical clothes dryer to something that can be several times that large. In the past few years, there have been some integrated circuit testers introduced that have the entire tester in the test head. However even in those cases, the test head is very large, consuming large amounts of floor space in costly clean rooms in IC factories.

In addition to being very large, the test heads of traditional testers are very heavy, requiring expensive, specialized positioning equipment that utilizes counter-balancing weights to allow the test head to be moved and positioned as needed.

The traditional approach to wafer sort using ATEs described above has several disadvantages:

1. Current ATEs takes up a lot of expensive floor space (often 25 square feet or more)
2. The typical ATE test head is very bulky and massive, and is difficult to manipulate.
3. The process of disconnecting and reconnecting the test head to switch probe cards and from the wafer prober can take several minutes which reduces test-floor productivity and throughput.
4. When the traditional test head is attached to the ATE, the operator does not have direct access to the probe card. He cannot easily examine and correct problems.
5. The traditional test head (and ATE system) is very expensive, impacting the cost associated with producing the ICs being tested.
6. Interfacing the large test head to the probes on the probe card requires signal lengths from the tester pins to the device pads of several inches. The length of this path results in a significant loading effect on both the tester and the device's output pins, resulting in degradation of signal quality. This loading also results in a need for testers to have high-current drivers that can overcome the loading effect of the long signal paths. That, in turn, increases power consumption and the need for heat dissipation.

7. Pogo pin connections are prone to failure due to effects such as oxidation and breakage of the pogo pin springs.

To some extent, each of these problems have been exacerbated in recent years with the increasing complexity of ICs in general and SOCs in particular. The combination of current testing methodology with the increasing complexity of SOCs in particular have meant that testing an increasing amount of pads, signals and circuitry, requires an increasing amount of time, space, power and ultimately money. This combination of traditional IC testing paradigms with chips of ever-increasing complexity has made thorough IC testing ever more difficult and expensive. It would be advantageous to address these difficulties.

SUMMARY

A unique tester described herein overcomes many of the above-described limitations in prior test equipment and methods. The described tester has an architecture in which modular tester resource units are interconnected via a network, such that the tester resource units are controlled by information sent serially over the network. Each module is capable of monitoring the network and determining when data addressed to it has arrived. When the address is recognized, the resource unit receives the data and acts accordingly. This architecture also provides ease of tester configuration and reconfiguration in that the modules are user installable. The network can use any of various networking protocols or implementations.

The use of a serial network to interconnect the modular tester resource units has the benefit of simplifying the system architecture of the tester, such that the backplane interconnection typical of conventional ATE testers (which can be a source of synchronization issues and interconnect issues) can be eliminated from the system architecture. The network communicates various information among the tester resource unit modules, such as instructions (e.g., command list and instruction sequencing), configuration data, and stimulus and response data.

The tester's architecture allows several new benefits, as enumerated below.

1 Commonality of test methods and equipment throughout the product development flow, so that a new IC design can be tested on the same equipment and software from engineering development through final production testing.
2 Different DFF-enabled (DFT stands for "Design-For-Test") designs require different numbers of scan chain driver pins and clock domains. The modularity of the tester architecture allows end-users to mix-and-match scan chain modules and clock driver modules.
3 The architecture may include a BIST (Built-In Self Test) driver module. This can be programmed for different devices to support a wide variety of BIST (Built-In Self Test) engines on the DUT (Device Under Test).
4 A general-purpose data acquisition module may be provided in the tester architecture. This allows the acquisition of sampled analog data for the purpose of verifying the analog portions of the DUT.
5 Additional modules may be included which contain specific interfaces to match common analog interfaces in current semiconductor devices, such as 802.11g wireless networking protocols.
6 A controller module, which drives legacy control interfaces such as RS-232, IEEE-1149 and GPIB, may be provided. By this means, a wide array of auxiliary test equipment such as power supplies can be controlled from the same test environment.
7 A current measurement module may be provided to allow the user to measure quiescent current measurements on the DUT.
8 A DC parametrics module may be provided to allow measurements for DC characterization.
9 A mechanism is provided to network all these modules together on a network 110 which is also connected to the computer on which work bench software 122 (e.g., the Teseda Work Bench (TWB), available from Teseda Corporation) executes. By this means, the work bench software can control all of the modules described in a synchronous manner.

Various testers based on this system architecture optionally can omit some of the above-mentioned tester resource unit modules, as well as including additional other modules than those summarized above.

A mechanism is provided to allow the test modules to synchronize with each other so that each can perform its portion of the overall test at the proper time in relation to the testing performed by other modules. This tester synchronization bus 118 (a suitable example of which conforms to the Teseda Synchronization Bus specification provided by Teseda Corporation) is also shown in the figure.

Additional features and advantages of the invention will be made apparent from the following detailed description of embodiments that proceeds with reference to the accompanying drawings.

DETAILED DESCRIPTION

The following description is directed to a tester architecture for use in testing semiconductor integrated circuits. The tester has a system architecture in which modular tester resource units are interconnected via a network and controlled by information sent serially over the network.

Terminology Overview

The following terminology is used below in describing components of the tester system architecture:

Test System Resource: A test system "resource" can be any single functional circuit or a collection of circuits designed to accomplish a task. There are various types of resources called "modules."

Test Module: A test system resource that contains test instrumentation and is controlled by the module network communications interface and synchronization bus. It is designed to have one or more connections to the DUT for applying test stimulus to the DUT and/or collecting responses from the DUT.

Power Module: A test system resource that is controlled by the module network communications interface and synchronization bus. It is designed to provide electrical power to the DUT in order facilitate testing.

System Modules (Storage Module, Control Module): A test system resource that is also controlled by the module network but is not connected to the DUT. These can include storage modules, control modules, etc.

Module Network: A communications interface for exchanging data between test system resources. A typical example of an embodiment would be a high speed serial communications interface, such as IEEE 1394 FireWire.

Tester Synchronization Bus (TSB): A high speed control interface for accurately synchronizing the action of multiple modules in time.

Test System: A collection of test modules and system modules configured to carry out tests on one or more DUTs either sequentially or in parallel.

Test Head: A collection of test modules and system modules mounted in an enclosure or sub-assembly.

Test System Controller: The device that is controlling the application of test stimulus to the DUT and the collection of responses. A typical embodiment of this is a computer workstation running test application software, such as the Teseda Workbench (TWB) available from Teseda Corporation. However, other embodiments are also possible.

Test Head Controller: An example of a control module that acts as a local controller for the module network and the module within a test head.

Tester System Architecture

Figure 1:
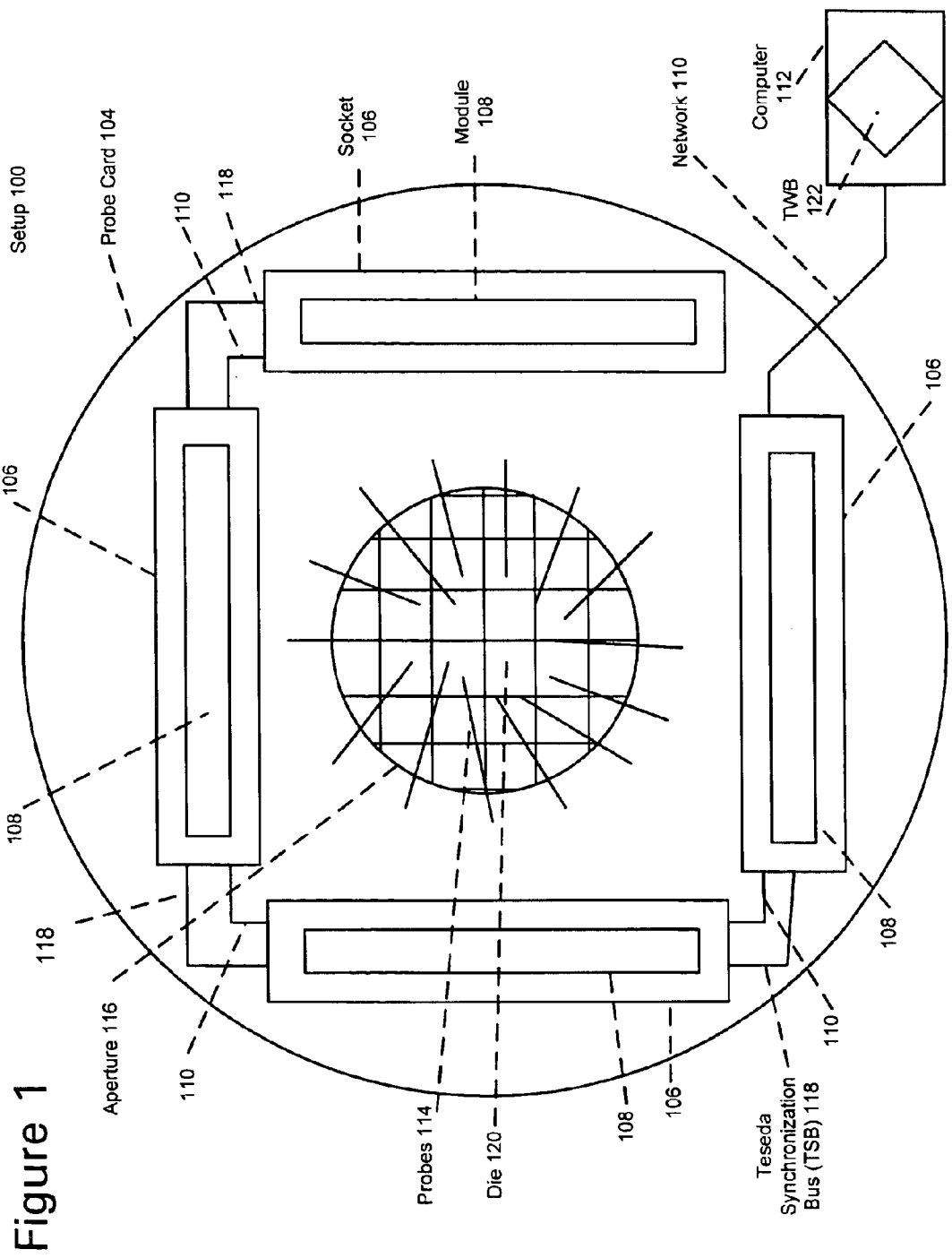
FIG. 1 is a block diagram of a system architecture for a tester of DFT semiconductor ICs.

One embodiment of the tester is shown in FIG. 1. The illustrated tester embodiment includes relevant portions of a DFT tester setup 100, a semiconductor wafer 102, a DFT probe card 104, test module sockets 106, test modules 108 installed in the sockets, a network 110 to connect all the modules together, and a computer 112 which is also connected to the network. The computer 112 uses this network 110 to initialize the test modules 108 with test data, extract test results at the conclusion of the test, and also to provide control commands during the execution of the test. However, the network 110 alternatively or additionally can be used for other purposes.

The network 110 as illustrated in FIG. 1 is a wired network such as FireWire (IEEE-1394), but other wired networking technologies such as USB, as well as wireless networking technologies such as IEEE 802.11b alternatively can be used.

FIG. 1 illustrates a setup of the tester including four sockets (and 4 modules), but alternative embodiments can include any number of modules installed in this way. The number of modules (in their sockets) which it is possible to install is limited only by the size of the probe card, which will be determined by the user of this equipment.

The probe card 104 is annular, with a central aperture 116 to allow test probes 114 to extend through the central aperture 116 and make electrical contact with one or more IC die 120 which have been fabricated on the wafer 102 to be tested.

In an alternate embodiment, the testing probes 114 are mounted such that they do not extend through the central aperture 116. In that embodiment, the probe card 104 is a disk without a central aperture 116 and the probes 114 are mounted on the side of the disk which is brought closest to the wafer 102 for testing. In yet another embodiment, the testing probes 114 are replaced with a socket connected to the probe card 104. A packaged die is inserted into this socket for testing after packaging. Further alternative embodiments include various combinations of these probe configurations.

In order to perform testing, the probe card 104 is positioned adjacent to the semiconductor wafer 102 so that the probes 114 make electrical contact with pads on one or more IC die 120 fabricated on the wafer 102. These pads may be located anywhere on the die. Once electrical contact has been established, the test is initiated by the TWB software 122 by sending commands to the test modules 108. Under the direction of these commands, the modules generate appropriate test stimuli (which are stored within the module) into the die 120 with which the probes 114 are in electrical contact. These test stimuli as generated by a combination of modules 108 are synchronized by using the Tester Synchronization Bus (TSB) 118 (e.g., conforming to the Teseda Synchronization Bus specification provided by Teseda Corporation) which is a synchronization protocol and a physical bus specification. The output of the die are examined and compared with expected values stored in the test modules, and discrepancies are noted and stored for later examination and evaluation by the TWB 122.

To facilitate this testing, the following types of modules 108 are envisioned:

1. Scan chain data driver module—drives scan chain data into the DFT-enabled DUT and records the outputs at the conclusion of the test.

2. Clock driver module—drives clock and scan-enable signals into the DUT.

3. Command/Control module—allows the TWB 122 to control auxiliary equipment such as power supplies over legacy interfaces such as RS-232, GPIB and others. In an alternate embodiment, these modules may be mounted and powered in a physical location other than the probe card 104 to facilitate simple connection to auxiliary equipment. Other combinations of command/control modules can be included in alternative embodiments of the tester.

4. BIST control and diagnostics module—allows the TWB 122 to control and interact with a Built In Self Test engine designed into the DUT. This BIST control module is programmable so that different BIST engines can be controlled by reprogramming the BIST control module. This module also permits diagnosis of design and implementation flaws in the BIST engine within the DUT.

5. Current measurement module—allows current measurements to be performed on the DUT.

6. Analog data stimulus and acquisition module—allows digitization and capture of analog data output from the DUT. Also allows analog voltages, either static or time-varying, to be driven into the DUT.

7. Specific Radio Frequency Standard Interface Module—Each such type of module is tuned to a specific Radio Frequency standard, such as 3G wireless telephony or 802.11g wireless networking standard. Depending upon the design of the DUT, one or more such modules would be selected from a large selection of available modules.

8. DC Parametrics module—allows DC characterization measurements on the DUT.

However, various other modules which operate within this architecture also can be included.

Figure 2:
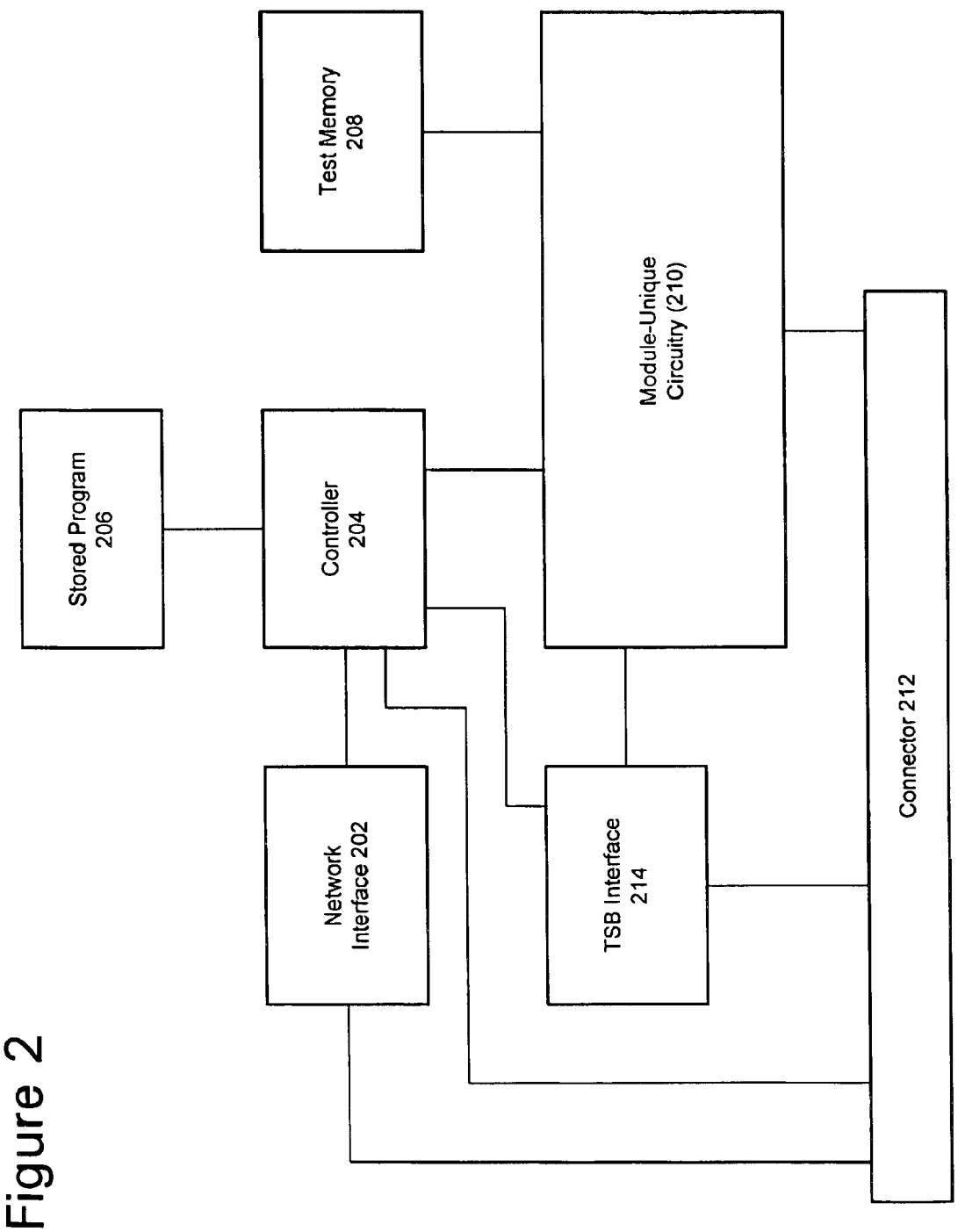
FIG. 2 is a block diagram of a module in the tester system architecture of FIG. 1.

The modules 108 described above have a common architecture, and are distinguished from one another by unique circuitry which is added to the common elements. A block diagram of the module architecture is shown in FIG. 2.

The module consists of a network interface 202, a controller 204, a controller program store 206, a test memory 208, a Tester Synchronization Bus (TSB) interface 214, a connector 212 and a module-unique circuitry 210. The function of these elements is described below.

1. Network interface (202)—connects the module to the wired or wireless network so that the module can be controlled by software resident on a remote computer.

2. Controller (204)—provides overall control of the module and serves as the communication conduit for communication with external objects on the network.

3. Stored program (206)—the program which operates and controls the module is stored here, and can be updated over the network.

4. Test Memory (208)—is used to store the test data which will be driven into the DUT and also to store the outputs of the DUT which might be recorded for later evaluation.

5. Module-unique circuitry (210)—this is the unique circuitry which implements the functions described earlier for the various module types available.

6. Connector (212)—allows the module to be plugged into the probe card 104 on which matching sockets 106 are installed.

Even though these functions are shown as separate blocks in FIG. 2, alternative implementations of the tester architecture can combine one or more of these blocks into a single block.

After testing die on the semiconductor wafer, the wafer is cut up into individual die. These are then installed into a protective package and the electrical contact pads on the die are connected to electrical contact points on the package which can be variously known as pins, pads or bumps (depending upon the style of package used). Once this process has been completed, it is again necessary to test the packaged die to verify that the process of packaging has not ruined it, and also to verify that the additional interconnect (from the die to the package) is correct and does not degrade the performance of the overall package to an unacceptable degree. To facilitate this testing, the described tester architecture incorporates the paradigm of using the same modules as were used during die testing on the semiconductor wafer. This is depicted in FIG. 3.

Figure 3:
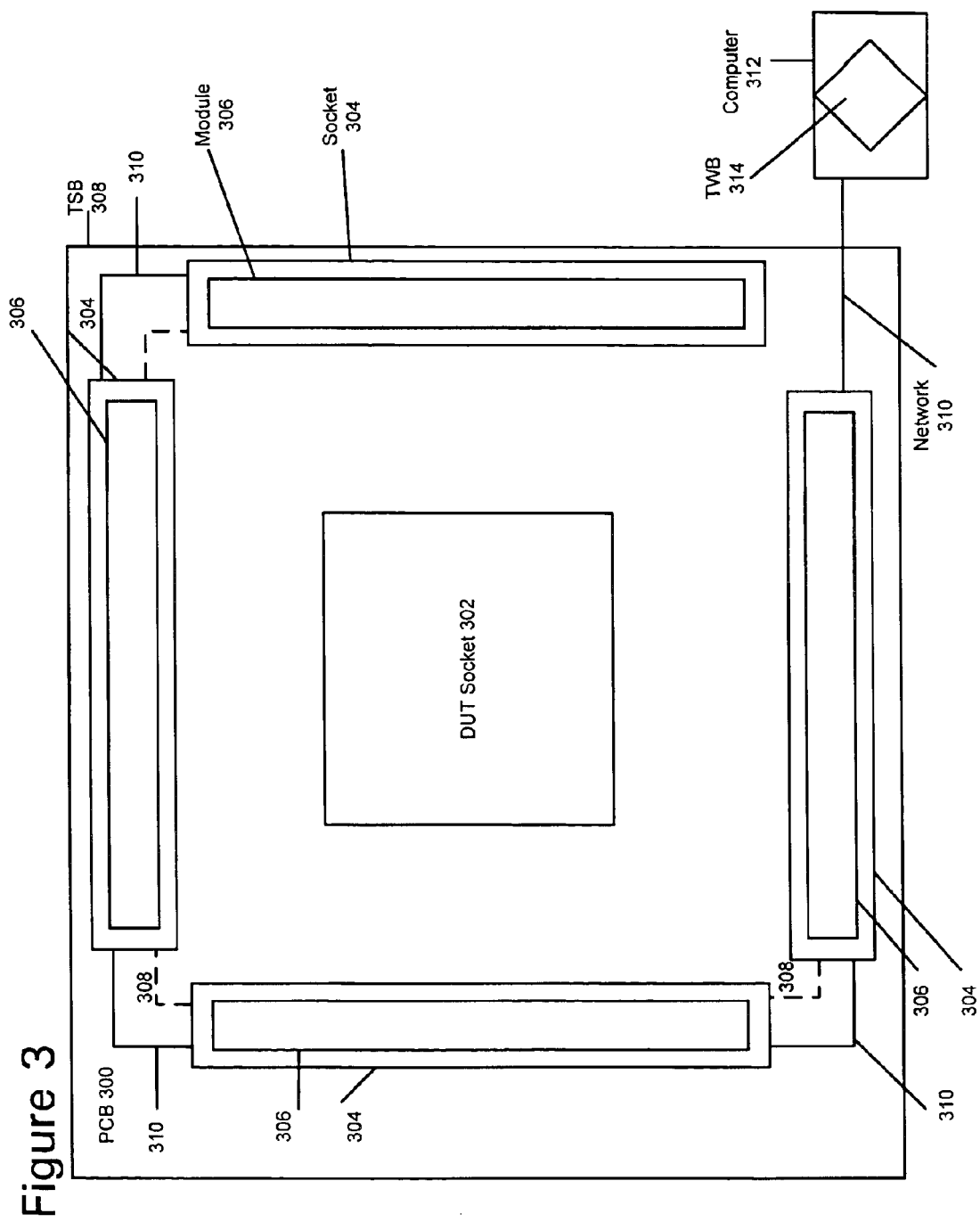
FIG. 3 is a view of a circuit board in the tester system architecture of FIG. 1 on which modules such as the module shown in FIG. 2 are mounted.

FIG. 3 shows a printed circuit board (PCB) 300 on which are mounted module sockets 304 (these are the same sockets as the sockets 106 in FIG. 1), into which are installed tester modules 306, which are the same modules as the FIG. 1 modules 108. The module/socket combinations are networked together via the network 310 (which can be either wired or wireless, even though the wired version is shown here), and are also connected to the Tester Synchronization Bus 308 (which is the same as the tester synchronization bus 118 in FIG. 1). The PCB also contains a DUT-socket 300 into which the packaged die will be installed for testing. A computer 312 running control software 314 is also connected to the network 310 to manage and control the testing process.

In order to perform testing, a mechanical handler places each chip to be tested into the DUT-socket 302. The control software 314 is informed (or senses) when the chip is correctly installed in the DUT-socket 300 and initiates testing. Upon completion of testing, the results are extracted from the modules 306, and the mechanical handler is instructed to remove the tested chip and replace it with another.

In an alternate embodiment, the DUT-socket 302 may be mounted on the opposite side of the printed circuit board 300 as the side on which the module sockets 304, modules 306 are mounted to facilitate integration with the mechanical handler. The sockets can be mounted in other configurations in alternative embodiments of the tester architecture.

In yet another embodiment, the modules 306 would be mounted in a sub-assembly (enclosed or otherwise) which would be installed into an existing packaged part handler for the purpose of testing packaged devices.

Figure 4:
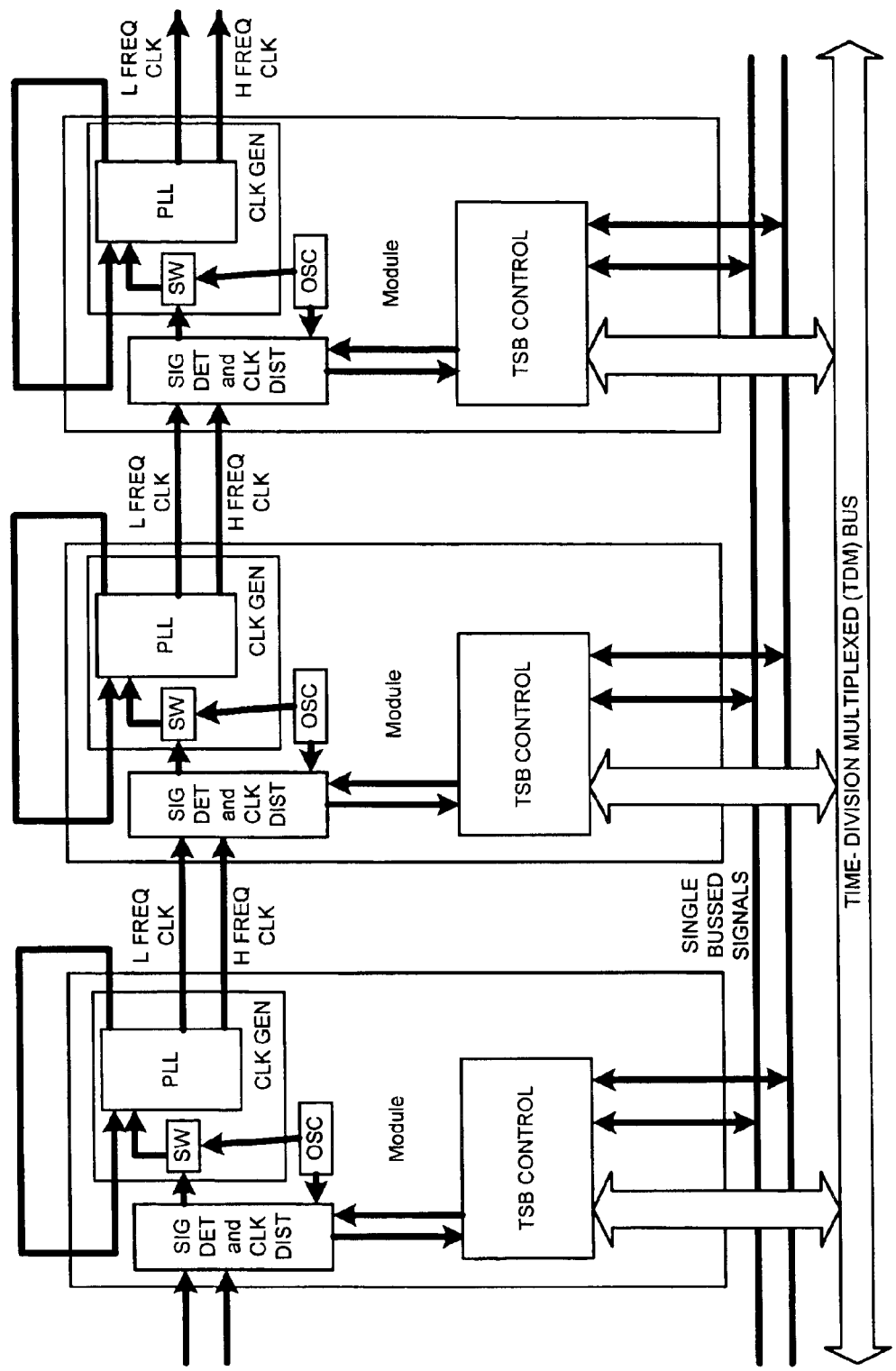
FIG. 4 is a block diagram of a synchronization bus in the tester system architecture of FIG. 1.

FIG. 4 shows the synchronization bus 118 (FIG. 1) and 308 (FIG. 3) used in the embodiment of the tester system architecture 100 of FIG. 1. The main purpose of the TSB is to maintain synchronization across all the test modules in the tester system architecture to guarantee an accurate test of a particular DUT.

With the synchronization bus, the tester system architecture achieves synchronization with the use of phase-locked clocks. Two clocks are used, a high frequency and a lower frequency clock. The system relies on the phase-locked nature of the circuit and careful PCB signal routing to achieve the desired clock edge alignment.

In addition to synchronizing the reference clocks of the individual modules, the synchronization bus also operates to guarantee the alignment of single pulse events such as the start and halt of the DUT test, or capturing of test failures, and any additional proprietary information that needs to be communicated from module to module within a test clock cycle. This is achieved by using a combination of single bussed signals and a time-division multiplexed bus, consisting of a reference clock, a frame pulse and the data bus.

Variants of the Tester System Architecture

The tester system architecture just described can include various possible arrangements of the tester system resources. These variations include, without limitation, direct control by the test system controller of the modules in a test system (as in the first example variation of the tester system shown in FIG. 5), or the interpretation and retransmission of commands and information by a local test head controller (as in the second example variation of the tester system shown in FIG. 6). Further, in the embodiment described above and shown in FIGS. 1–3, the tester system architecture is arranged with the modular tester resource units all located on the probe card or load board within a test head. While in some other variations of the tester system architecture, some of the test modules may be located external to a testhead. In first and second example variations of the tester systems (FIGS. 5 and 6) described below, some test instrumentation modules may be present on the DUT probe card or load board and are under the control of the test system via a module network connection.

Figure 5:
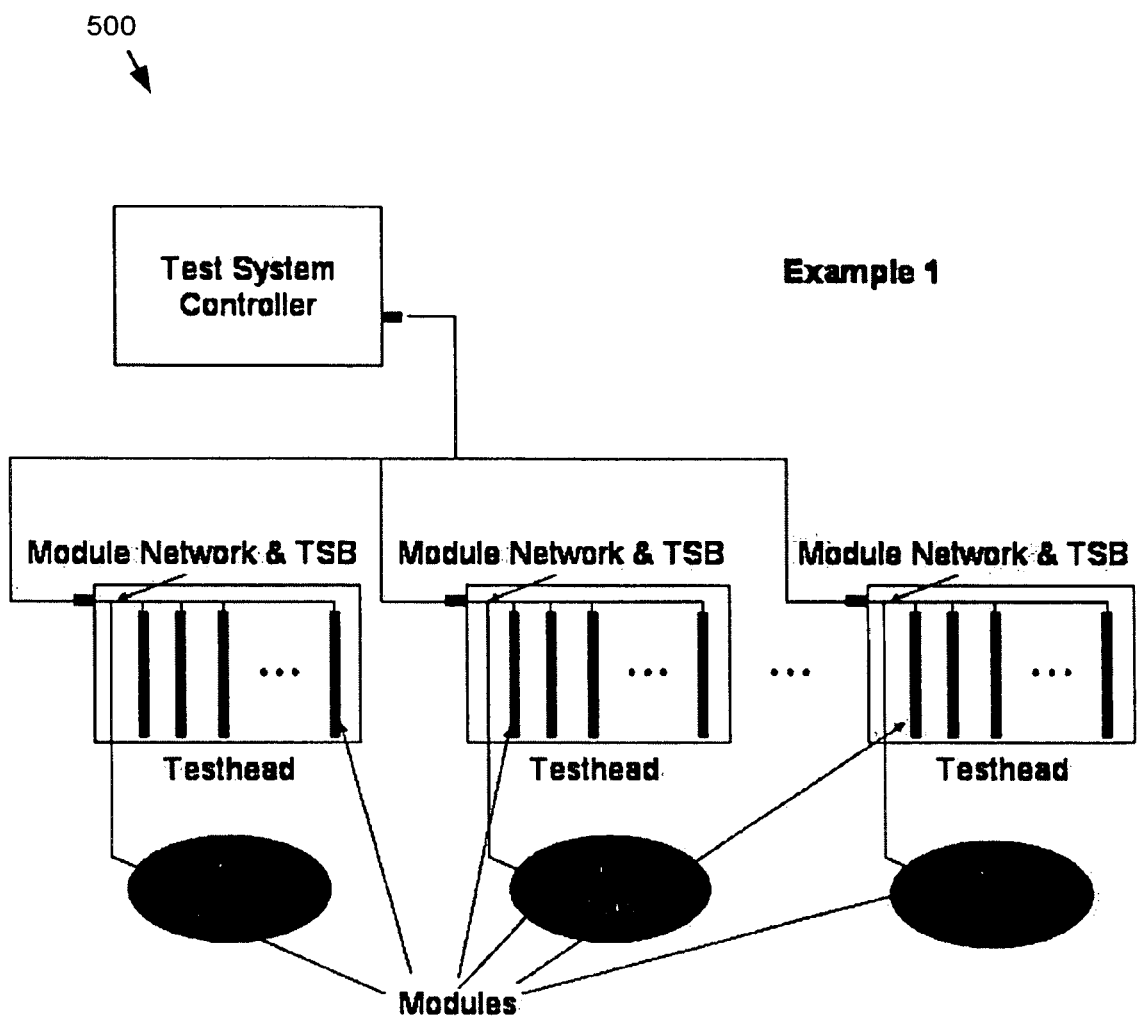
FIG. 5 is a block diagram of a first example variation of a tester system based on the tester system architecture of FIG. 1.

FIG. 5 shows a first example variant 500 of the tester system architecture 100 (FIG. 1) that employs a "flat" variation of the system architecture. More specifically, in this flat version of the system architecture, the test system controller communicates directly with every module in the system. Also, in this first example variation 500, modules located externally to the testhead chassis are physically connected to the DUT card.

Figure 6:
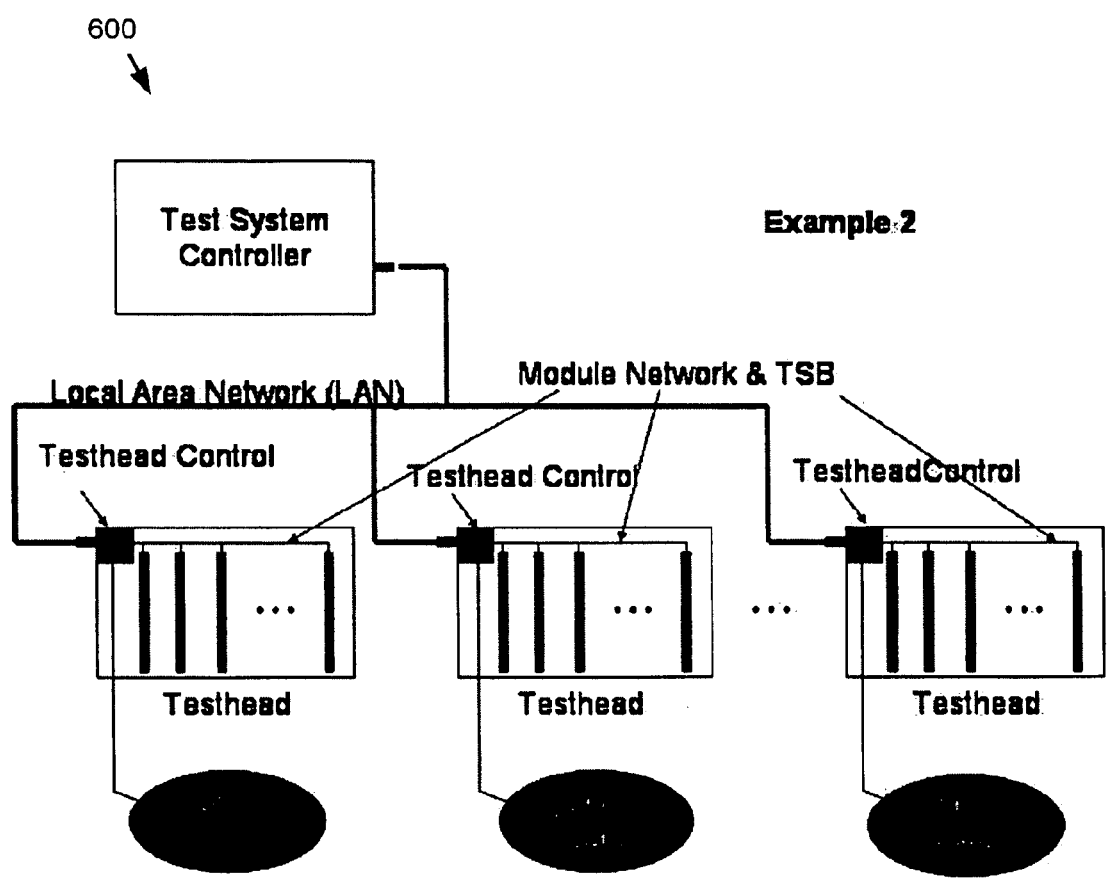
FIG. 6 is a block diagram of a second example variation of a tester system based on the tester system architecture of FIG. 1.

FIG. 6 depicts a second example variant 600 in which the tester system architecture 100 (FIG. 1) is hierarchical. In this case, the test system controller communicates with multiple test head controllers provided in the separate test heads, so as to improve the efficiency and throughput of the overall test system. The test head controllers can themselves be test modules of the architecture 100.

Figure 7:
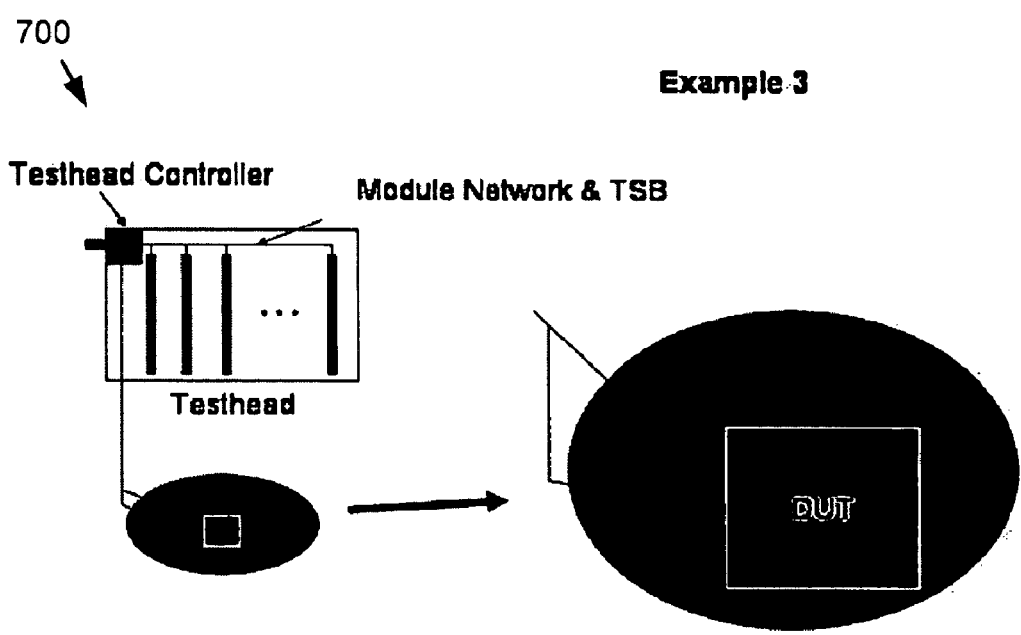
FIG. 7 is a block diagram of a third example variation of a tester system based on the tester system architecture of FIG. 1.

FIG. 7 depicts a third example variant 700, which uses another standard control mechanism (e.g., the IEEE 1149.1 standard test access port, described in "IEEE Std 1149.1-1990 IEEE Standard Test Access Port and Boundary-Scan Architecture," IEEE, 1990) in conjunction with the tester system architecture 100 (FIG. 1) to facilitate certain DUT control requirements. For example, the tester system architecture can switch the DUT into the "test" state, and thus activate a high speed test interface and protocol on the DUT. In this way, the tester architecture 100 can maintain compatibility with other standards including, for example, the IEEE P1500 Standard For Embedded Core Test of the IEEE P1500 Working Group on a Standard for Embedded Core Test (SECT), and other IC test standards. The third example variant of the tester system architecture 100 does not limit testing of the DUT to a particular time or location. For example, once the device has been inserted into a PC board, it can still be placed into test mode and its port accessed.

Figure 8:
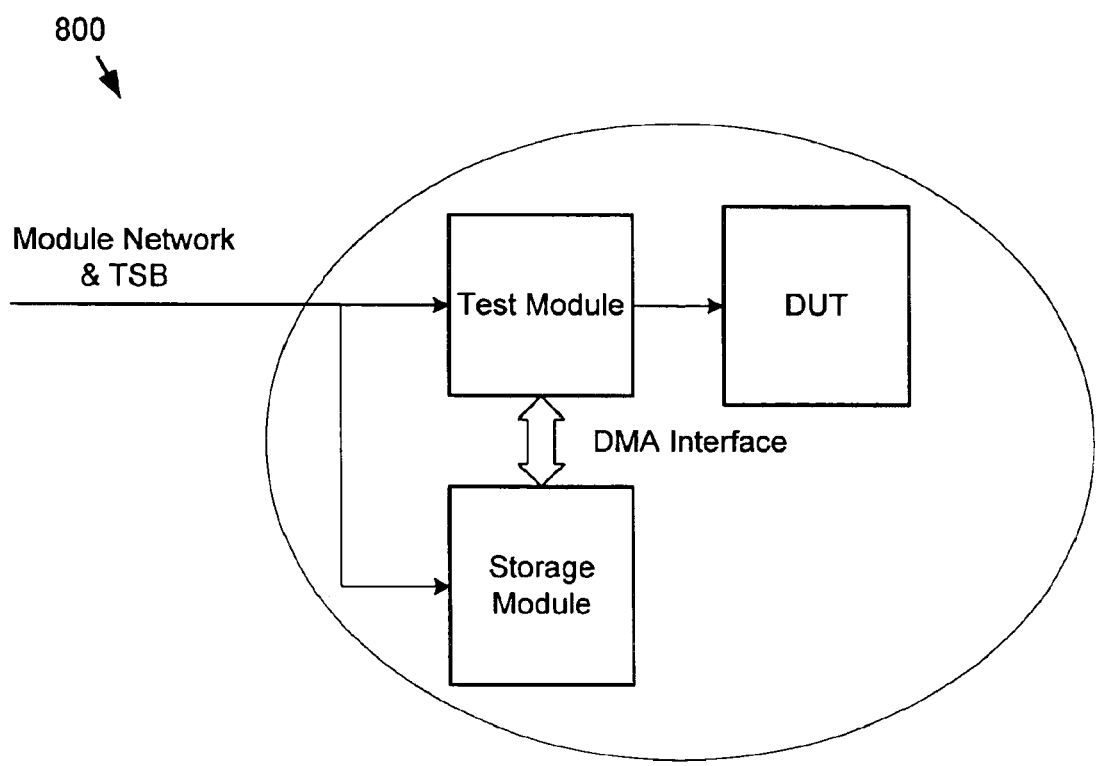
FIG. 8 is a block diagram of a fourth example variation of a tester system based on the tester system architecture of FIG. 1.

FIG. 8 shows a further example variant 800 of the tester system architecture 100 that supports the ability for the test system to collect data from multiple DUTs in large quantities during production test while minimally impacting the test throughput time. While the tester system architecture is not limited to such applications, a typical application of this example variation of the tester system architecture is to conditionally collect detailed information for all failing devices to support rapid analysis and isolation of the cause of the failures. This is in contrast to traditional ATE system architectures which are optimized for "go/no-go" testing, and do not typically provide the ability to collect large amounts of diagnostic data on the fly. In the variant 800, a storage module initially stores diagnostic data. The storage module can be implemented in a variety of ways, ranging from memory embedded in a test module to a dedicated storage device such as a disk drive. The DUT diagnostic data is logged via a high speed path, such as a DMA channel to minimize impact on test throughput. The data can then be unloaded more slowly over the module network to the test system controller for analysis after a series of devices have been tested.

In view of the many possible embodiments to which the principles of our invention may be applied, we claim as our invention all such embodiments as may come within the scope and spirit of the following claims and equivalents thereto.

We claim:

1. A tester device for testing semiconductor integrated circuits, comprising:
   a plurality of test modules;
   a circuit board carrying a plurality of test module sockets;
   a synchronization bus interconnecting the test module sockets;
   wherein the test modules have a common architecture comprising a network interface, a controller, program storage, a test memory, module-specific circuitry and a socket connector for connecting the respective test module in a respective test module socket.

2. The tester device of claim 1, comprising a BIST driver module programmable to exercise a BIST engine of a semiconductor device under test.

3. The tester device of claim 1, comprising a data acquisition module operative to acquire sampled analog data for the purpose of verifying the analog portions of the semiconductor device under test.

4. The tester device of claim 1, comprising an interface module having an interface for interfacing with an analog interface of the semiconductor device under test.

5. The tester device of claim 1, comprising a controller module having driving circuitry for driving a control interface of the semiconductor device under test.

6. The tester device of claim 1, comprising a current measurement module for measuring quiescent current measurements of the semiconductor device under test.

7. The tester device of claim 1, comprising a DC parametrics module for performing measurements for DC characterization of the semiconductor device under test.

* * * * *